(12) United States Patent
Pigott et al.

(10) Patent No.: US 7,973,570 B2
(45) Date of Patent: Jul. 5, 2011

(54) SAMPLE-AND-HOLD (S/H) CIRCUIT

(75) Inventors: John M. Pigott, Phoenix, AZ (US);
Sergey S. Ryabchenkov, Moscow (RU)

(73) Assignee: Freescale Semiconductor, Inc., Austin, TX (US)

( * ) Notice: Subject to any disclaimer, the term of this patent is extended or adjusted under 35 U.S.C. 154(b) by 89 days.

(21) Appl. No.: 12/541,345

(22) Filed: Aug. 14, 2009

(65) Prior Publication Data
US 2010/0164551 A1   Jul. 1, 2010

(51) Int. Cl.
G11C 27/02   (2006.01)
H03K 5/00   (2006.01)
H03K 17/00   (2006.01)

(52) U.S. Cl. ............................... 327/95; 327/96
(58) Field of Classification Search .......... 327/337, 327/91, 94–97
See application file for complete search history.

(56) References Cited

U.S. PATENT DOCUMENTS

| | | | | |
|---|---|---|---|---|
| 5,338,988 | A * | 8/1994 | Yamamura et al. | 327/306 |
| 5,498,986 | A * | 3/1996 | Manlove | 327/77 |
| 6,069,502 | A | 5/2000 | Preslar et al. | |
| 6,469,561 | B2 * | 10/2002 | Pernigotti et al. | 327/336 |
| 2002/0024363 | A1 * | 2/2002 | Fujimoto | 327/94 |
| 2006/0055436 | A1 * | 3/2006 | Gaboriau et al. | 327/94 |

* cited by examiner

*Primary Examiner* — Quan Tra
(74) *Attorney, Agent, or Firm* — Ingrassia Fisher & Lorenz, P.C.

(57) ABSTRACT

A sample-and-hold circuit (100) is provided that that includes a sample-and-hold switch (125), an integrator circuit (180) designed to generate an output voltage ($V_{OUT}$) signal, and a bias voltage ($V_{BIAS}$) source (185). The sample-and-hold switch (125) incldues a first switch (130), a second switch (140), and a third switch (150). The first switch (130) has a first gate (132), a first source (134) and a first drain (134), the second switch (140) has a second gate (142), a second source (144) electrically coupled to a bulk region (147), and a second drain (146), and the third switch (150) has a third gate (152), a third drain (154), and a third source (156) coupled to the first source (136). The integrator circuit (180) includes an output operational amplifier (170) having an inverting input ($V_-$) (172) coupled to the second drain (146) and a non-inverting input ($V_+$). The bias voltage ($V_{BIAS}$) source (185) applies a bias voltage ($V_{BIAS}$) to the third drain and the non-inverting input ($V_+$) to drive a gate-to-source voltage ($V_{GS}$) of the second switch (140) to an optimum negative value that reduces a sub-threshold leakage current ($I_{DS}$) and a Gate Induced Drain Lowering (GIDL) leakage current in the second switch (140), and to drive a drain-to-source voltage ($V_{DS}$) of the second switch (140) is biased at a low value equal to an offset voltage ($V_{OFFSET}$) of the output operational amplifier (170) to minimize a drain-to-bulk current ($I_{DB}$) in the second switch (140).

22 Claims, 2 Drawing Sheets

SAMPLE-AND-HOLD (S/H) CIRCUIT

CROSS-REFERENCES TO RELATED APPLICATIONS

This application claims the benefit of PCT International Application No. PCT/RU2008/000817, filed Dec. 30, 2008.

TECHNICAL FIELD

Embodiments of the subject matter described herein relate generally to sample-and-hold (S/H) circuits. More particularly, embodiments of the subject matter relate to sample-and-hold (S/H) circuits with a long hold time and low voltage droop during this long hold time.

BACKGROUND

Sample-and-hold (S/H) circuits are used in systems when a varying analog input voltage signal needs to be sampled and processed at a later time. For instance, in one application, a S/H circuit may be used to temporarily store an analog signal until such time as an analog-to-digital converter can convert the signal level to a digital. A S/H circuit acquires an analog input voltage signal sampled at an instant and stores or "holds" the voltage sample for a time duration (i.e., specified period of time) on a hold capacitor before processing so that it may be converted to a digital value. S/H circuits have two operating states or modes—sample mode and hold mode. During a an acquisition or "sample" mode, a control signal closes a switch (e.g., a metal oxide semiconductor field-effect transistor (FET)) so that an analog input voltage signal representation is present on the hold capacitor. During a "hold" mode, a switch in the S/H circuit is opened, and the sampled signal that is stored on the hold capacitor is available as an output voltage.

Desired characteristics of a S/H circuit include short acquisition time during the sample mode and low voltage droop during hold mode. To explain further, there is a settling time after the sample command until the output reaches its value representing the input. After the hold command, an aperture time is the time after which changes of the input voltage no longer affect the output voltage signal. The sample or "acquisition" time is the time for the output voltage signal to settle within an accuracy (e.g., 0.1%) of the input voltage being acquired. In other words, the acquisition time represents the amount of time required for the hold capacitor to charge to a voltage level which accurately corresponds to the input signal. When the S/H circuit is in hold mode, the voltage droop rate ($\mu V/\mu s$) refers to the change in the output voltage that is being "held" over time due to leakage currents.

While short acquisition time and low voltage droop are desirable, optimizing the performance of S/H circuit necessarily involves making compromises since improving one parameter tends to degrade the other. Among other things, the acquisition time and voltage droop rate depend on the size of the hold capacitor. A larger hold capacitor decreases voltage droop, but increases acquisition time since it takes longer for the hold capacitor to charge. By contrast, a smaller hold capacitor decreases acquisition time since the hold capacitor can charge more quickly, but increases voltage droop since there is less capacitance, and therefore the effect of a given amount of leakage current is greater.

A common problem in many sample-and-hold circuits is leakage current. As used herein, the term "leakage" refers to a gradual change in stored charge on a charged hold capacitor. Leakage is caused by the unwanted transfer of charge from electronic devices that are coupled to the hold capacitor, such as a transistor or diode, either of which conducts a small amount of current even when turned off. For instance, tunneling leakage can occur through semiconductor junctions between heavily doped P-type and N-type diffusions. Sub-threshold leakage occurs when carriers can leak between a source and a drain of a Metal Oxide Semiconductor (MOS) transistor when the gate-to-source voltage ($V_{GS}$) is below the threshold voltage ($V_{TH}$).

During the hold mode, leakage currents can cause the output voltage sample being held on the hold capacitor to droop (i.e., discharge) or to increase, depending on the polarity of the leakage current. In other words, the voltage droop is dependent on the leakage current from the hold capacitor to other components connected thereto including a S/H switch. To reduce voltage droop during hold mode it is desirable to reduce current flow from the hold capacitor. One approach to reducing voltage droop is to simply increase the size of the hold capacitor (e.g., to much greater than 100 picofarads), but as noted above, this increases acquisition time and also increase the size and therefore the cost of this component. For example, in applications where a very long hold time (e.g., 100 milliseconds) is required, there is longer period for charge to leak from the hold capacitor and cause drooping of the output voltage sample that is being held by the hold capacitor. At the same time, it may not be feasible to increase the size of the hold capacitor if other constraints exist (e.g., constraints regarding acquisition time). In situations where simply increasing the size of the hold capacitor is not an option, more creative solutions are needed to reduce leakage currents It is desirable to provide an improved sample-and-hold circuit with improved performance. For example, it is desirable to provide an improved sample-and-hold circuit that is designed to have a long hold time and low voltage droop during this long hold time. Furthermore, other desirable features and characteristics will become apparent from the subsequent detailed description and the appended claims, taken in conjunction with the accompanying drawings and the foregoing technical field and background.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
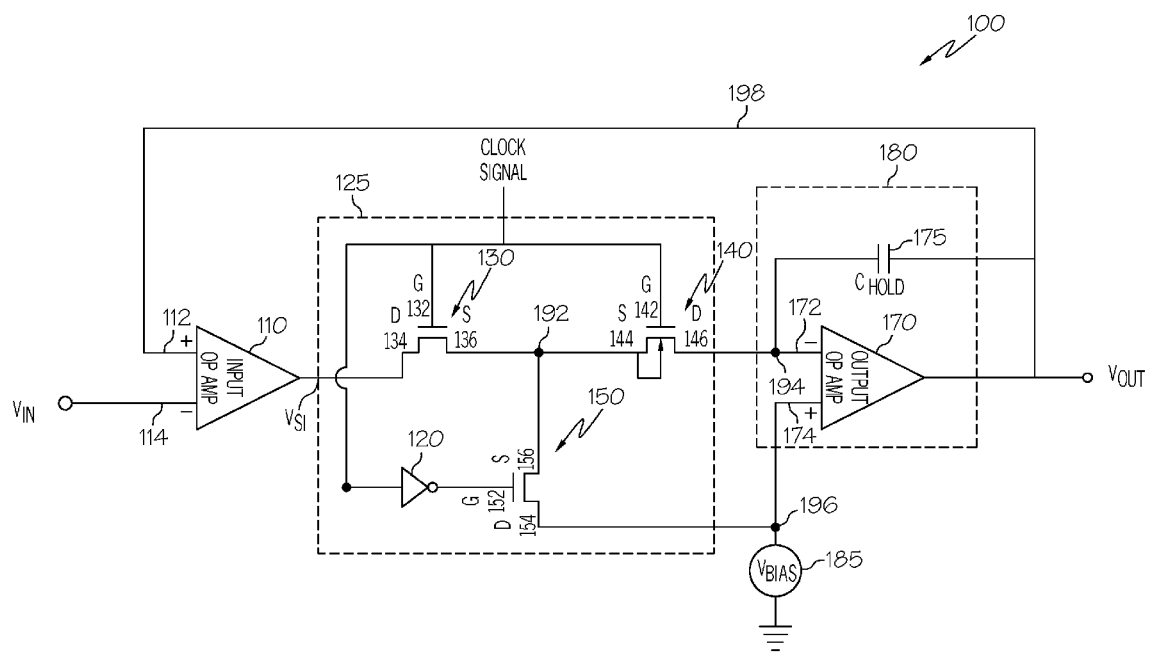
FIG. 1 is a circuit schematic which illustrates an improved sample-and-hold circuit in accordance with an exemplary embodiment of the present invention.

The following detailed description is merely exemplary in nature and is not intended to limit the invention or the application and uses of the invention. The word "exemplary" is used herein to mean "serving as an example, instance, or illustration." Any embodiment described herein as "exemplary" is not necessarily to be construed as preferred or advantageous over other embodiments. All of the implementations described below are exemplary implementations provided to enable persons skilled in the art to make or use the invention and are not intended to limit the scope of the invention which is defined by the claims. Furthermore, there is no intention to be bound by any expressed or implied theory presented in the preceding technical field, background, brief summary or the following detailed description.

Techniques and technologies may be described herein in terms of functional and/or logical block components and various processing steps. It should be appreciated that such block components may be realized by any number of hardware, software, and/or firmware components configured to perform the specified functions. For example, an embodiment of a system or a component may employ various integrated circuit components, e.g., memory elements, digital signal processing elements, logic elements, or the like, which may carry out a variety of functions under the control of one or more control devices. In addition, those skilled in the art will appreciate that embodiments described herein are merely exemplary implementations.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element.

The connecting lines shown in the various figures contained herein are intended to represent example functional relationships and/or physical couplings between the various elements. It should be noted that many alternative or additional functional relationships or physical connections may be present in other embodiments of the subject matter. The following description refers to elements or nodes or features being "connected" or "coupled" together. As used herein, unless expressly noted otherwise, "connected" means that one element/node/feature is directly joined to (or directly communicates with) another element/node/feature, and not necessarily mechanically. Likewise, unless expressly noted otherwise, "coupled" means that one element/node/feature is directly or indirectly joined to (or directly or indirectly communicates with) another element/node/feature, and not necessarily mechanically. In addition, the terms "first," "second," "third," "fourth" and the like in the description and the claims, if any, may be used for distinguishing between similar elements and not necessarily for describing a particular sequential or chronological order or to indicate that a particular element includes a particular number specified by the numerical ordinal. For instance, if a third switch is described as having a third gate, a third source and a third drain, this does not mean that the switch has three gates, three source and three drains. To the contrary, it simply distinguishing the gate, the source and the drain of the third switch from the gate, the source and the drain of another switch. It is to be understood that the terms so used are interchangeable under appropriate circumstances such that the embodiments of the invention described herein are, for example, capable of operation in sequences other than those illustrated or otherwise described herein.

Figure 2:
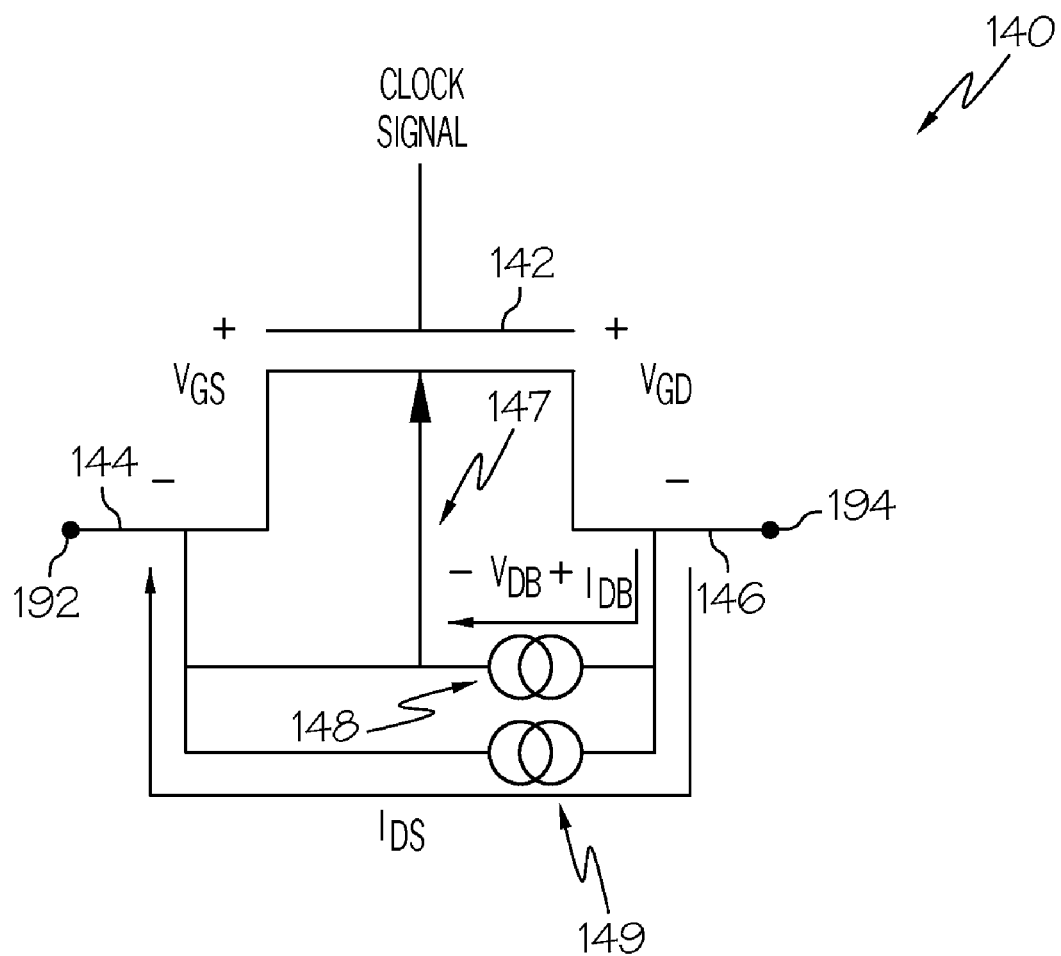
FIG. 2 is a circuit schematic which illustrates a sample-and-hold (S/H) switch that can be used in accordance with an exemplary embodiment of the present invention.

Thus, although the schematics illustrated in FIGS. 1 and 2 depict an exemplary arrangement of elements, additional intervening elements, devices, features, or components may be present in embodiments of the depicted subject matter.

Overview of Exemplary Embodiments

Embodiments of the present invention generally relate to an improved sample-and-hold circuit is provided that is designed to have a long hold time and low voltage droop during this long hold time.

In one embodiment, the sample-and-hold (S/H) circuit includes an enhanced sample-and-hold switch, an integrator circuit designed to generate an output voltage ($V_{OUT}$) signal, and a bias voltage ($V_{BIAS}$) source. The enhanced sample-and-hold switch includes a first switch, a second switch, and a third switch. The first switch has a first drain, the second switch has a second gate, a second source electrically coupled to a bulk region, and a second drain, and the third switch has a third gate, a third drain, and a third source coupled to the first source. The integrator circuit includes an output operational amplifier having a non-inverting input ($V_+$). The bias voltage ($V_{BIAS}$) source coupled to the third drain and the non-inverting input ($V_+$) to apply the bias voltage ($V_{BIAS}$) to the third drain and the non-inverting input ($V_+$). The third switch and the bias voltage ($V_{BIAS}$) source operate during hold mode to drive a gate-to-source voltage ($V_{GS}$) of the second switch to an optimum negative value that reduces a sub-threshold leakage current ($I_{DS}$) and a Gate Induced Drain Lowering (GIDL) leakage current in the second switch, and a drain-to-source voltage ($V_{DS}$) of the second switch is biased at a low value equal to an offset voltage ($V_{OFFSET}$) of the output operational amplifier to minimize a drain-to-bulk current ($I_{DB}$) in the second switch. In one implementation, the second switch is a long channel MOSFET having a channel that has a length greater than a technology minimum channel length, and may also include a bulk region surrounding the second source and the second drain such that the second source is electrically connected to the bulk region and is maintained at the bias voltage ($V_{BIAS}$) when operating in hold mode.

Exemplary Embodiments

FIG. 1 is a circuit schematic which illustrates an improved sample-and-hold (S/H) circuit 100 in accordance with an exemplary embodiment of the present invention. The circuit 100 is designed to reduce leakage currents even during very long hold times (e.g., 100 milliseconds) and thereby prevent drooping of the output voltage ($V_{OUT}$) sample during hold mode.

The circuit 100 comprises an input operational amplifier 110, an enhanced sample-and-hold switch 125, a sample-and-hold (S/H) integrator circuit 180, and a bias voltage ($V_{BIAS}$) source 185. The sample-and-hold (S/H) integrator circuit 180 comprises an output operational amplifier 170 and a hold capacitor ($C_{HOLD}$) capacitor 175. FIG. 1 will be described below with reference to FIG. 2, which is a circuit schematic that illustrates a low leakage sample-and-hold (S/H) MOSFET switch 140 and components of its leakage current in accordance with another exemplary embodiment of the present invention.

The input operational amplifier 110 has a non-inverting input ($V_+$) 112 that receives an output voltage ($V_{OUT}$) signal that is fed back via feedback loop 198, an inverting input ($V_-$) 114 designed to receive an analog input voltage ($V_{IN}$) signal, a positive power supply ($V_{S+}$) (not illustrated) and a negative power supply ($V_{S-}$) (not illustrated). The input operational amplifier 110 generates a source voltage ($V_{S1}$) signal in response to the inputs at the non-inverting input ($V_+$) 112 and the inverting input ($V_-$) 114. The gain of the input operational amplifier 110 improves acquisition time by providing a larger error signal to the integrator circuit 180 during signal acquisition.

The enhanced sample-and-hold switch 125 includes an inverter 120, and three switches 130, 140, 150. The inverter 120 is designed to receive a clock signal (CLK) and to generate an inverted clock signal (ICLK). Switch 130 comprises a gate 132 that receives the clock signal (CLK), a drain 134 that receives the source voltage ($V_{S1}$) signal, and a source 136 coupled to node 192. Switch 150 comprises a gate 152 that receives the inverted clock signal (ICLK), a drain 154 coupled to node 196, and a source 156 coupled to node 192. In one implementation, switches 130, 150 can be MOSFETs having a minimum channel length for a specific technology capability. As used herein, the term "technology minimum channel length" refers to the minimum channel length for MOSFETs fabricated in and on a particular integrated circuit (IC) die that the S/H circuit 100 is fabricated in and on using a particular processing technology. For example, when the S/H circuit 100 is fabricated in and on a semiconductor substrate using a processing technology in which a minimum channel length that can be achieved is 0.25 µm, then the technology minimum channel length is 0.25 µm. In other implementations, switches 130, 150 can be MOSFETs have a channel length greater than the minimum channel length for a specific technology capability. As will be described below, switch 140 may have a channel length that is greater than that of switches 130 and 150. In the specific implementation illustrated in FIG. 1, the switches 130, 140, 150 are NMOSFETs; however, depending on the specific implementation, the switches 130, 140, 150 described herein can also be PMOSFETs.

By contrast, the sample-and-hold (S/H) switch 140 is a low leakage, long channel MOSFET and can be a low voltage device if the voltage levels driving it are restricted. As illustrated in FIG. 2, the S/H switch 140 includes a gate 142 that receives clock signal (CLK), a source 144 that is at a source voltage ($V_S$) and that is coupled in series with the source 136 of switch 130 at node 192, a drain 146 that is at a drain voltage ($V_D$) and that is coupled to 172 at node 194, and a bulk region 147 defined between the source 144 and the drain 146 that is at a bulk voltage ($V_B$). As indicated by the arrow symbol, the bulk region 147 is electrically coupled to the source 144. As such, the bulk voltage ($V_B$) is equal to the source voltage ($V_S$).

The channel of the S/H switch 140 is defined in the bulk region 147 between the source 144 and the drain 146. The channel may have a length greater than the minimum channel length for MOSFETs fabricated using a particular processing technology in and on the particular integrated circuit (IC) die that the S/H circuit 100 is fabricated in and on. For instance, in one non-limiting example provided solely for purposes of illustrating an example of what the term "greater than the minimum channel length" means, when the S/H circuit 100 is fabricated using a processing technology in which the minimum channel length that can be achieved is 0.25 µm, then the channel length of the S/H switch 140 can be 1.0 µm. By making the channel length of the S/H switch greater than the minimum channel length used in a particular processing technology, a drain-to-source current ($I_{DS}$) in the channel of the S/H switch 140 can be reduced. By keeping the channel length longer than a minimum channel length, sub-threshold leakage current ($I_{DS}$) can be reduced. As such, the improved sample-and-hold circuit 100 reduces sub-threshold leakage current ($I_{DS}$) in the S/H switch 140 from drawing charge from the hold capacitor 175 during a hold mode. Alternatively, it allows a smaller hold capacitor 175 to be used and thereby improve acquisition time.

In S/H switch 140, a drain-to-source voltage ($V_{DS}$) is present between the source 144 and the drain 146, a gate-to-source voltage ($V_{GS}$) is present between the gate 142 and the source 144, and a drain-to-bulk voltage ($V_{DB}$) is present between the bulk region 147 and the drain 146. Equations (1) and (2) below express drain-to-bulk current ($I_{DB}$) and sub-threshold drain-to-source current ($I_{DS}$), respectively in S/H switch 140. In equations (1) and (2), $I_{S1}$ and $I_{S2}$ are reverse bias saturation currents, and the quantity (kT/q) represents a thermal voltage ($V_T$), which is approximately 25.85 mV at 300 degrees K (i.e., a temperature close to "room temperature"), and where q is the magnitude of charge on an electron (the elementary charge), k is Boltzmann's constant, and T is the absolute temperature of a p-n junction in kelvin units. The quantity 'n' represents the sub-threshold slope of the S/H switch 140, and is the inverse of the ratio of the slope of a log plot of drain current ($I_D$) versus gate voltage ($V_G$) for the S/H switch 140 to the slope of a similar plot for a bipolar transistor.

$$I_{DB} = I_{s1}\left(1 - e^{\frac{-qV_{DB}}{kT}}\right) \propto I_{s1}\frac{qV_{DB}}{kT}, \text{ when } |V_{DB}| \ll \frac{kT}{q} \quad \text{Equation (1)}$$

$$I_{DS} = I_{s2} \cdot e^{\frac{qV_{GS}}{nkT}}\left(1 - e^{\frac{-qV_{DS}}{kT}}\right) \propto I_{s2} \cdot e^{\frac{qV_{GS}}{nkT}} \cdot \frac{qV_{DS}}{kT}, \quad \text{Equation (2)}$$

$$\text{when } |V_{DS}| \ll \frac{kT}{q}$$

In the sample-and-hold (S/H) integrator circuit 180, the output operational amplifier 170 has a positive power supply ($V_{S+}$) (not illustrated), a negative power supply ($V_{S-}$) (not illustrated), an inverting input ($V_-$) 172 coupled to node 194 and a non-inverting input ($V_+$) 174 coupled to node 196. The output operational amplifier 170 generates an output voltage ($V_{OUT}$) signal. The hold capacitor ($C_{HOLD}$) capacitor 175 is coupled to the inverting input ($V_-$) 172 at node 194 to provide a feedback path for the output voltage ($V_{OUT}$) signal. The hold capacitor ($C_{HOLD}$) capacitor 175 holds a voltage sample of the analog input voltage ($V_{IN}$) signal during hold mode. In the S/H integrator circuit 180 it is desirable that the offset voltage ($V_{OFFSET}$) of output operational amplifier 170 be as low as possible to minimize the absolute value of the drain-to-source voltage ($V_{DS}$) that is applied across S/H switch 140 during hold mode.

The bias voltage ($V_{BIAS}$) source 185 is coupled to the drain 154 of switch 150 and the non-inverting input ($V_+$) 174 of output operational amplifier 170 at node 196. The bias voltage ($V_{BIAS}$) source 185 biases the drain 154 of switch 150 and the non-inverting input ($V_+$) 174 of output operational amplifier 170 at the bias voltage ($V_{BIAS}$). The optimal value of the bias voltage ($V_{BIAS}$) depends on the specific implementation. In one implementation, the bias voltage ($V_{BIAS}$) source 185 can be adjustable to that the value of the bias voltage ($V_{BIAS}$) can be adjusted to the optimal value that minimizes leakage currents in the S/H switch 140 during hold mode for a particular application. This implementation is also useful when the optimal value of the bias voltage ($V_{BIAS}$) is difficult to determine analytically since it can allow the value of the bias voltage ($V_{BIAS}$) to be adjusted during manufacturing to determine an optimal value for a particular implementation.

Sample Mode

During sample mode, the analog input voltage ($V_{IN}$) signal is applied to the inverting input ($V_-$) 114, which drives the input operational amplifier 110 and causes the source voltage ($V_{S1}$) signal to go high/low. The switch 130 and the S/H switch 140 are turned on by the high clock signal (CLK), and the switch 150 is turned off by the inverted low clock signal (ICLK). When the high/low source voltage ($V_{S1}$) signal drives the output voltage ($V_{OUT}$) signal low/high, and the low/high output voltage ($V_{OUT}$) signal is fedback via feedback loop 198 such that the low/high output voltage ($V_{OUT}$) signal at non-inverting input ($V_+$) 112 eventually servoes to a value within the offset voltage of operational amplifier 110 to the analog input voltage ($V_{IN}$) signal being applied to the inverting input ($V_-$) 114.

Hold Mode Operation

During hold mode, the switch 130 and the S/H switch 140 are turned off by the low clock signal (CLK), and the switch 150 is turned on by the inverted high clock signal (ICLK). Ideally, if no current flows through the S/H switch 140, a voltage on hold capacitor 175 will not change, and therefore the output voltage ($V_{OUT}$) will not change and will remain held at its previous value on the hold capacitor 175. However, it is not possible to completely turn off the S/H switch 140. When the S/H switch 140 conducts current, even slightly, charge from the hold capacitor 175 leaks to balance leakage currents flowing in the S/H switch 140. As such, during hold mode, it is desirable to control the gate voltage and drain-to-source voltages of the S/H switch 140 to reduce the charge leaking from the hold capacitor 175 as much as possible since this will minimize droop (i.e., change with time of the stored output voltage ($V_{OUT}$) sample).

In accordance with embodiments of the present invention, techniques are provided for reducing leakage currents in the S/H switch 140 that would otherwise flow during hold mode. For example, in accordance with one such technique, the gate-to-source voltage ($V_{GS}$) and drain-to-source voltage ($V_{DS}$) of the switch 140 are biased to ensure that such leakage currents are reduced. As will be explained below, the gate-to-source voltage ($V_{GS}$) of the switch 140 is biased to an optimal negative value (e.g., –200 millivolts), and the drain-to-source voltage ($V_{DS}$) of the switch 140 is driven to a low value that is as close to zero as possible (i.e., slightly positive or slightly negative).

There are different potential leakage currents associated with the S/H switch 140. One is a sub-threshold leakage current ($I_{DS}$), another is a drain-to-bulk current ($I_{DB}$) and another is caused by a Gate Induced Drain Lowering (GIDL) leakage current. GIDL is a phenomenon whereby off-state leakage currents in a MOSFET will increase as the gate voltage ($V_G$) is further decreased due to direct tunneling of carriers through the drain-bulk junction. When the gate-to-source voltage ($V_{GS}$) of S/H switch 140 is zero or greater, a significant sub-threshold leakage current ($I_{DS}$) will result since S/H switch 140 will continue to conduct slightly.

To reduce leakage currents generated within S/H switch 140, the switch 150 and the bias voltage ($V_{BIAS}$) source 185 operate to drive the gate-to-source voltage ($V_{GS}$) of the S/H switch 140 to a predetermined optimum negative value which minimizes the sum of GIDL and sub-threshold leakage currents. To explain further, during hold mode, switch 150 is turned on and the bias voltage ($V_{BIAS}$) source 185 biases node 192 through the switch 150 to same voltage as node 196. Also, the gate 142 of S/H switch 140 is driven to 0 volts, causing the gate-to-source voltage ($V_{GS}$) of the S/H switch 140 to be equal to the negative of the value of the bias voltage ($V_{BIAS}$) source 185. Thus, the bias voltage ($V_{BIAS}$) source 185, in conjunction with switch 150, drives the gate-to-source voltage ($V_{GS}$) of the switch 140 to an optimum negative value to ensure that leakage currents in S/H switch 140 are minimized. In one implementation, the bias voltage ($V_{BIAS}$) source 185 has a value of 200 millivolts and the gate-to-source voltage ($V_{GS}$) of the S/H switch 140 is driven to a value of approximately –200 millivolts. This reduces sub-threshold leakage current ($I_{DS}$), which is described in Equation (2), and also avoids GIDL leakage current which would otherwise increase if the gate was driven more negatively.

The bias voltage ($V_{BIAS}$) source 185 also biases the non-inverting input ($V_+$) 174 of output operational amplifier 170 at the bias voltage ($V_{BIAS}$). The output operational amplifier 170 has a low offset voltage ($V_{OFFSET}$) between the inverting input ($V_-$) 172 and the non-inverting input ($V_+$) 174 of the output operational amplifier 170 and the non-inverting input ($V_+$) 174 is biased with the bias voltage ($V_{BIAS}$). The drain-to-source voltage ($V_{DS}$) of the switch 140 is driven to this low offset voltage ($V_{OFFSET}$) when switch 150 is turned on. The term "low offset voltage ($V_{OFFSET}$)" refers to a voltage having a minimized absolute value "much less" than the absolute value of the quantity (kT/q) ("or thermal voltage ($V_T$)"), which is approximately 25.85 millivolts at 300 degrees kelvin. Here, the term "much less" means at least eighty percent less than the absolute value of the quantity (kT/q). In one implementation, "much less" can be in the range of approximately fifty percent less than the absolute value of the quantity (kT/q), and approximately ninety percent less than the absolute value of the quantity (kT/q). As described in Equations (1) and (2) above, when the absolute value of the offset voltage ($V_{OFFSET}$) (and hence the drain-to-source voltage ($V_{DS}$) of the switch 140) is much less than the absolute value quantity (kT/q) or thermal voltage ($V_T$), the exponential portion of equations (1) and (2) simplify. In one implementation, the "low offset voltage ($V_{OFFSET}$)" is approximately ±ten millivolts or less than the absolute value of the quantity (kT/q) ("or thermal voltage ($V_T$)"), and in another implementation is approximately ±five millivolts or less than twenty percent of the absolute value of the quantity (kT/q) ("or thermal voltage ($V_T$)"), and is ideally as close to zero as practical. Driving the drain-to-source voltage ($V_{DS}$) of the switch 140 to this low value reduces the drain-to-bulk current ($I_{DB}$) and drain-to-source current ($I_{DS}$), which are described in Equations (1) and (2).

EXAMPLE

To illustrate an example of how the circuit 100 would operate with specific values, consider an example where the analog input voltage ($V_{IN}$) signal that is applied to the inverting input ($V_-$) 114 is 2.0 volts and the bias voltage ($V_{BIAS}$) of the bias voltage ($V_{BIAS}$) source 185 is 200 millivolts. When acquisition/sample mode is complete, the output voltage ($V_{OUT}$) will ideally be at approximately 2.0 volts.

During hold mode, the switch 130 and the S/H switch 140 are turned off by the clock signal (CLK), which is low, and the switch 150 is turned on by the inverted clock signal (ICLK), which is high. The gate 132, 142 voltages ($V_G$) will be zero volts. The switch 150 effectively operates like a resistor. In this mode, the bias voltage ($V_{BIAS}$) source 185 biases the non-inverting input ($V_+$) 174 of output operational amplifier 170 at the bias voltage ($V_{BIAS}$) of 200 millivolts. The inverting input ($V_-$) 172 of output operational amplifier 170 will also be at approximately 200 millivolts because the output operational amplifier 170 is operating in a closed loop circuit. As such, the drain-to-source voltage ($V_{DS}$) of the switch 140 is driven to the offset voltage ($V_{OFFSET}$) between the inverting input ($V_-$) 172 and the non-inverting input ($V_+$) 174 of the second output operational amplifier 170 because switch 150 is on. This reduces the drain-to-bulk current ($I_{DB}$), which is described in Equation (1) and sub-threshold leakage current ($I_{DS}$) which is described in Equation (2). The bias voltage ($V_{BIAS}$) source 185 biases the drain 154 of switch 150 at the bias voltage ($V_{BIAS}$) of 200 millivolts, which biases the source 144 of S/H switch 140 at a voltage of 200 millivolts resulting in the gate-to-source voltage ($V_{GS}$) of the switch 140 being biased to an optimal negative value of –200 millivolts. In other words, the bias voltage ($V_{BIAS}$) source 185 operating in conjunction with the S/H switch 140, drives the gate-to-source voltage ($V_{GS}$) of the switch 140 to an optimum negative value of approximately 200 millivolts to ensure that leakage currents in S/H switch 140 are reduced. This reduces sub-threshold leakage current ($I_{DS}$), which is described in Equation (2), and also avoids GIDL leakage current. This way the S/H switch 140 turned off as much as possible to prevent charge from leaking from the hold capacitor 175, which reduces droop in the output voltage ($V_{OUT}$) being held by hold capacitor 175 during hold mode even during long holding periods. For instance, in one implementation, the improved sample-and-hold circuit exhibits less than a 20 millivolts droop during a hold time of 100 milliseconds at +150 degrees Celcius.

Thus, the improved sample-and-hold circuit 100 improves S/H performance. The improved sample-and-hold circuit 100 includes a low-voltage, low-leakage S/H switch 140. When operating in hold mode, sub-threshold leakage current ($I_{DS}$) (and also GIDL leakage current) can be reduced by biasing the low-leakage S/H switch 140 at a low drain-to-source voltage ($V_{DS}$), and at optimal negative value of gate-to-source voltage ($V_{GS}$). Reduced sub-threshold leakage current ($I_{DS}$), Gate Induced Drain Lowering (GIDL) leakage current, and drain-to-bulk current ($I_{DB}$) results in lower droop and hence more accurate output even during a long hold time. The bias voltage ($V_{BIAS}$) and the offset voltage ($V_{OFFSET}$) can be controlled independently of each other, which allows the value of the gate-to-source voltage ($V_{GS}$) of the S/H switch 140 to be controlled independently of the value of the drain-to-source voltage ($V_{DS}$) of the S/H switch 140. This low-leakage S/H switch 140 also allows low voltage devices to be used in a higher voltage S/H integrator circuit 180 because there is no direct relationship between the voltage capability of the low-voltage, low-leakage S/H switch 140 and the output voltage ($V_{OUT}$) of the sample-and-hold circuit 100. Thus, the sample-and-hold circuit 100 can be used to sample-and-hold a voltage greater than the breakdown voltage of switch 140 if the voltage levels driving switch 140 are restricted.

While at least one example embodiment has been presented in the foregoing detailed description, it should be appreciated that a vast number of variations exist. For example, in one implementation, an appropriately sized dummy switch for charge injection (not shown) can be added to the circuit of FIG. 1. The dummy switch has a gate coupled to node 194, and a source, drain and bulk coupled to the output of inverter 120. The dummy switch injects a charge to node 194 that cancels the charge injected to node 194 when S/H switch 140 is turned off. This minimizes a small error voltage that is the difference between the output voltage ($V_{OUT}$) during sample mode and during hold mode. It should also be appreciated that the example embodiment or embodiments described herein are not intended to limit the scope, applicability, or configuration of the claimed subject matter in any way. Rather, the foregoing detailed description will provide those skilled in the art with a convenient roadmap for implementing the described embodiment or embodiments. It should also be understood that various changes can be made in the function and arrangement of elements without departing from the scope defined by the claims, which includes known equivalents and foreseeable equivalents at the time of filing this patent application.

What is claimed is:

1. A sample-and-hold (S/H) circuit, comprising:
   a sample-and-hold switch, comprising:
   a first switch comprising a first gate, a first source and a first drain;
   a second switch comprising a second gate that receives a clock signal (CLK), a second source coupled in series to the first drain, a second drain, and a bulk region, the bulk region being electrically coupled to the second source; and
   a third switch comprising a third gate that receives an inverted clock signal (ICLK), a third drain, and a third source directly coupled to the first source;
   an integrator circuit for generating an output voltage ($V_{OUT}$) signal, and comprising:
   an output operational amplifier having an output, an inverting input ($V_-$) coupled to the second drain and a non-inverting input ($V_+$); and
   a hold capacitor having a first terminal coupled to the output of the output operational amplifier and a second terminal coupled to the inverting input of the output operational amplifier; and
   a bias voltage ($V_{BIAS}$) source coupled to the third drain and the non-inverting input ($V_+$) to apply a bias voltage ($V_{BIAS}$) to the third drain and the non-inverting input ($V_+$).

2. A sample-and-hold (S/H) circuit according to claim 1, wherein the bias voltage ($V_{BIAS}$) source drives a gate-to-source voltage ($V_{GS}$) of the second switch to a predetermined optimum negative value when operating in a hold mode.

3. A sample-and-hold (S/H) circuit according to claim 2, wherein the third switch and the bias voltage ($V_{BIAS}$) source operate during the hold mode to drive the gate-to-source voltage ($V_{GS}$) of the second switch to the predetermined optimum negative value that minimizes leakage currents in the second switch.

4. A sample-and-hold (S/H) circuit according to claim 3, wherein, during the hold mode, the third switch is turned on and the bias voltage ($V_{BIAS}$) source biases the second source at the bias voltage ($V_{BIAS}$), and wherein the second gate is driven to zero volts thereby causing the gate-to-source voltage ($V_{GS}$) of the second switch to be equal to a negative value of the bias voltage ($V_{BIAS}$) to drive the gate-to-source voltage ($V_{GS}$) of the second switch to the predetermined optimum negative value to reduce a sub-threshold leakage current ($I_{DS}$) and a Gate Induced Drain Lowering (GIDL) leakage current in the second switch.

5. A sample-and-hold (S/H) circuit according to claim 1, wherein the bias voltage ($V_{BIAS}$) source biases the non-inverting input ($V_+$) of output operational amplifier at the bias voltage ($V_{BAIS}$), and wherein the bias voltage ($V_{BAIS}$) source biases the second non-inverting input ($V_+$) of the output operational amplifier at the bias voltage ($V_{BAIS}$) to generate a low offset voltage ($V_{OFFSET}$) between the inverting input ($V_-$) and the non-inverting input ($V_+$), and wherein a drain-to-source voltage ($V_{DS}$) of the second switch is driven to the low offset voltage ($V_{OFFSET}$) to reduce a drain-to-bulk leakage current ($I_{DB}$) and a drain-to-source leakage current ($I_{DS}$) when operating in the hold mode.

6. A sample-and-hold (S/H) circuit according to claim 5, wherein an absolute value of the low offset voltage ($V_{OFFSET}$) is less than a magnitude of a thermal voltage ($V_T$) of the second switch that is equal to a quantity (kT/q), where q is a magnitude of charge on an electron, k is Boltzmann's constant, and T is the absolute temperature of a p-n junction in Kelvin units.

7. A sample-and-hold (S/H) circuit according to claim 1, wherein the second switch is a long channel MOSFET having a channel that has a length greater than a technology minimum channel length.

8. A sample-and-hold (S/H) circuit according to claim 7, wherein the second source is connected to the bulk region and is maintained at the bias voltage ($V_{BIAS}$) when operating in the hold mode.

9. A sample-and-hold (S/H) circuit according to claim 1, further comprising:
an input operational amplifier comprising:
a non-inverting input ($V_+$) for receiving the output voltage ($V_{OUT}$) signal as feedback;
an inverting input ($V_-$) for receiving an analog input voltage ($V_{IN}$) signal, and wherein the input operational amplifier provides an output source voltage ($V_{S1}$) signal.

10. A sample-and-hold (S/H) circuit designed to have a long hold time and low voltage droop during hold time, comprising:
an input operational amplifier having a first inverting input ($V-$) designed to receive an analog input voltage ($V_{IN}$) signal, a first non-inverting input ($V_+$), and wherein the input operational amplifier designed to generate a source voltage ($V_{S1}$) signal;
a sample-and-hold switch, comprising:
an inverter designed to receive a clock signal (CLK) and to generate an inverted clock signal (ICLK);
a first switch coupled to a first node;
a second switch comprising a gate that receives the clock signal (CLK), a source coupled to the first node, a drain coupled to a second node, and a bulk region, wherein the bulk region is electrically coupled to the source; and
a third switch comprising a gate that receives the inverted clock signal (ICLK), a drain coupled to a third node, and a source directly coupled to the first node;
an integrator circuit, comprising: an output operational amplifier having an inverting input ($V_-$) coupled to the drain of the second switch and a second non-inverting input ($V_+$) coupled to the third node, wherein the output operational amplifier is designed to generate an output voltage ($V_{OUT}$) signal at an output thereof that is provided to the first non-inverting input ($V_+$) of the input operational amplifier; and a hold capacitor ($C_H$) capacitor coupled between the second node and the output of the output operational amplifier; and
a bias voltage ($V_{BIAS}$) source coupled to the third node such that the drain of the third switch and the non-inverting input ($V_+$) of the output operational amplifier are biased at a bias voltage ($V_{BIAS}$), wherein the bias voltage ($V_{BIAS}$) source drives a gate-to-source voltage ($V_{GS}$) of the second switch to a predetermined optimum negative value when operating in a hold mode.

11. A sample-and-hold (S/H) circuit according to claim 10, wherein the third switch and the bias voltage ($V_{BIAS}$) source operate during the hold mode to drive the gate-to-source voltage ($V_{GS}$) of the second switch to the predetermined optimum negative value.

12. A sample-and-hold (S/H) circuit according to claim 11, wherein, during the hold mode, the third switch is turned on and the bias voltage ($V_{BIAS}$) source biases the second source at the bias voltage ($V_{BIAS}$), and wherein the gate of the second switch is driven to zero volts thereby causing the gate-to-source voltage ($V_{GS}$) of the second switch to be equal to a negative value of the bias voltage ($V_{BIAS}$) to drive the gate-to-source voltage ($V_{GS}$) of the second switch to a predetermined optimum negative value to reduce a sub-threshold leakage current ($I_{DS}$) and a Gate Induced Drain Lowering (GIDL) leakage current in the second switch.

13. A sample-and-hold (S/H) circuit according to claim 10, wherein the first non-inverting input ($V_+$) of the input operational amplifier receives a feedback version of the output voltage ($V_{OUT}$) signal; and
wherein the bias voltage ($V_{BIAS}$) source biases the second non-inverting input ($V_+$) of output operational amplifier at the bias voltage ($V_{BIAS}$), and wherein the bias voltage ($V_{BIAS}$) source biases the second non-inverting input ($V_+$) of the output operational amplifier at the bias voltage ($V_{BIAS}$) to generate a low offset voltage ($V_{OFFSET}$) between the inverting input ($V_-$) of the output operational amplifier and the non-inverting input ($V_+$) of the output operational amplifier, and wherein a drain-to-source voltage ($V_{DS}$) of the second switch is driven to the low offset voltage ($V_{OFFSET}$) to reduce a drain-to-bulk leakage current ($I_{DB}$) and a drain-to-source leakage current ($I_{DS}$) when operating in the hold mode.

14. A sample-and-hold (S/H) circuit according to claim 13, an absolute value of the low offset voltage ($V_{OFFSET}$) is less than a magnitude of a thermal voltage ($V_T$) of the second switch that is equal to a quantity (kT/q), where q is a magnitude of charge on an electron, k is Boltzmann's constant, and T is the absolute temperature of a p-n junction in Kelvin units.

15. A sample-and-hold (S/H) circuit, comprising:
a sample-and-hold switch, comprising: a first switch comprising a first gate, a first source and a first drain; a second switch comprising a second gate that receives a clock signal (CLK), a second source coupled in series to the first drain and, a second drain; and a third switch comprising a third gate that receives an inverted clock signal (ICLK), a third drain, and a third source directly coupled to the first source;
an integrator circuit designed to generate an output voltage ($V_{OUT}$) signal, and comprising: an output operational amplifier having an output, an inverting input ($V_-$) coupled to the second drain, and a non-inverting input ($V_+$);
a storage device having a first terminal coupled to the output of the integrator circuit and a second terminal coupled to the inverting input of the integrator circuit; and
a bias voltage ($V_{BIAS}$) source coupled to the third drain and the non-inverting input ($V_+$) of the integrator circuit to apply a bias voltage ($V_{BIAS}$) to the third drain and the non-inverting input ($V_+$) of the integrator circuit, wherein the third switch and the bias voltage ($V_{BIAS}$) source operate during a hold mode to drive a gate-to-source voltage ($V_{GS}$) of the second switch to an optimum negative value.

16. A sample-and-hold (S/H) circuit according to claim 15, wherein, during the hold mode, the third switch is turned on and the bias voltage ($V_{BAIS}$) source biases the second source at the bias voltage ($V_{BIAS}$), and wherein the second gate is driven to zero volts thereby causing the gate-to-source voltage ($V_{GS}$) of the second switch to be equal to a negative value of the bias voltage ($V_{BIAS}$) to drive the gate-to-source voltage ($V_{GS}$) of the second switch to a predetermined optimum negative value to reduce a sub-threshold leakage current ($I_{DS}$) and a Gate Induced Drain Lowering (GIDL) leakage current in the second switch.

17. A sample-and-hold (S/H) circuit according to claim 15, wherein the bias voltage ($V_{BIAS}$) source biases the non-inverting input ($V_+$) of output operational amplifier at the bias voltage ($V_{BIAS}$), and wherein the bias voltage ($V_{BIAS}$) source biases the non-inverting input ($V_+$) of the output operational amplifier at the bias voltage ($V_{BIAS}$) to generate a low offset voltage ($V_{OFFSET}$) between the inverting input ($V_-$) and the non-inverting input ($V_+$), and wherein a drain-to-source voltage ($V_{DS}$) of the second switch is driven to the low offset voltage ($V_{OFFSET}$) to reduce a drain-to-bulk leakage current ($I_{DB}$) and a drain-to-source leakage current ($I_{DS}$) when operating in the hold mode, and wherein an absolute value of the low offset voltage ($V_{OFFSET}$) is much less than a magnitude of a thermal voltage ($V_T$) of the second switch that is equal to a quantity (kT/q), where q is a magnitude of charge on an electron, k is Boltzmann's constant, and T is the absolute temperature of a p-n junction in Kelvin units.

18. A sample-and-hold (S/H) circuit according to claim 15, wherein the second switch is a long channel MOSFET having a channel that has a length greater than a technology minimum channel length, and wherein the second switch further comprises:

a bulk region defined between the second source and the second drain, wherein the second source is connected to the bulk region and is maintained at the bias voltage ($V_{BIAS}$) when operating in the hold mode.

19. A sample-and-hold (S/H) circuit according to claim 15, further comprising:

an input operational amplifier designed to receive an analog input voltage ($V_{IN}$) signal, and a fedback version of the output voltage ($V_{OUT}$) signal, and to output a source voltage ($V_{S1}$) signal.

20. A sample-and-hold (S/H) circuit according to claim 1, wherein the first gate receives the clock signal (CLK).

21. A sample-and-hold (S/H) circuit according to claim 10, wherein the first switch comprises a first gate, a first source and a first drain, and wherein the first gate receives the clock signal (CLK).

22. A sample-and-hold (S/H) circuit according to claim 15, wherein the first gate receives the clock signal (CLK).

* * * * *

UNITED STATES PATENT AND TRADEMARK OFFICE
CERTIFICATE OF CORRECTION

PATENT NO. : 7,973,570 B2  
APPLICATION NO. : 12/541345  
DATED : July 5, 2011  
INVENTOR(S) : John M. Pigott and Sergey S. Ryabchenkov Page 1 of 1

It is certified that error appears in the above-identified patent and that said Letters Patent is hereby corrected as shown below:

In the Abstract, line 1, remove the second word "that" before the word "includes"

In Claim 10, column 11, lines 38-39, delete the second word "capacitor" after the symbol "(CH)"

In Claim 19, column 14, line 4, correct the spelling of the word "fedback" to "feedback"

Signed and Sealed this
Twenty-seventh Day of September, 2011

David J. Kappos
*Director of the United States Patent and Trademark Office*